United States Patent [19]

Konishi

[11] Patent Number: 4,604,641

[45] Date of Patent: Aug. 5, 1986

[54] SEMICONDUCTOR DEVICE AND METHOD FOR MANUFACTURING THE SAME

[75] Inventor: Satoshi Konishi, Tokyo, Japan

[73] Assignee: Tokyo Shibaura Denki Kabushiki Kaisha, Japan

[21] Appl. No.: 445,247

[22] Filed: Nov. 29, 1982

[30] Foreign Application Priority Data

Nov. 30, 1981 [JP] Japan .................................. 56-192228

[51] Int. Cl.[4] ...................... H01L 23/48; H01L 23/54
[52] U.S. Cl. .......................................... 357/59; 357/71
[58] Field of Search .................................... 357/71, 59

[56] References Cited

U.S. PATENT DOCUMENTS

| | | |
|---|---|---|
| 3,881,971 | 5/1975 | Greer et al. . |
| 4,128,670 | 12/1978 | Gaensslen . |
| 4,163,246 | 7/1979 | Aomura et al. . |
| 4,178,674 | 12/1979 | Liu et al. ................................ 357/59 |
| 4,240,097 | 12/1980 | Raymond, Jr. . |
| 4,278,989 | 7/1981 | Baba et al. . |
| 4,297,721 | 10/1981 | McKenny et al. ..................... 357/59 |

FOREIGN PATENT DOCUMENTS

| | | |
|---|---|---|
| 0016577 | 10/1980 | European Pat. Off. . |
| 0032025 | 7/1981 | European Pat. Off. . |
| 0029108 | 3/1980 | Japan . |
| 0056958 | 4/1982 | Japan ................................ 357/71 S |
| 2019091 | 10/1979 | United Kingdom . |

OTHER PUBLICATIONS

"An Advanced PSA Technology for High Speed Bipolar LSI"—Nakashiba et al—IEEE Transactions on Electron Devices, vol. ED-27, No. 8—Aug. 1980, pp. 1390-1394.

"Polysilicon Resistor Process for Bipolar and MOS Applications"—Ning—IBM Technical Disclosure Bulletin, vol. 23, No. 1, Jun.—1980, pp. 368-370.

Okada et al., "A 4K Static Bipolar TTL RAM"; ISSCC 78/Thursday, Feb. 16, 1978.

Akazawa et al., "A High-Speed 1600'Gate Bipolar LSI Processor"; ISSCC 78/Friday, Feb. 17, 1978; IEEE Solid-State Circuits Conference.

Primary Examiner—Andrew J. James
Assistant Examiner—S. V. Clark
Attorney, Agent, or Firm—Finnegan, Henderson, Farabow, Garrett & Dunner

[57] ABSTRACT

The invention provides a semiconductor device having a semiconductor substrate with an active region including a buried contact and a field region including a field insulation layer. The device also includes a first polysilicon layer formed in the active region and on the field insulation layer, and a second polysilicon layer a portion of which is formed on said first polysilicon layer and another portion of which is formed on an isolation film covering a portion of the first polysilicon layer. The portion of the second polysilicon layer which is located above the field insulation layer is doped with metal or has a surface covered with a metal film. The semiconductor devices of the present invention operate at a high speed and are made small due to the use of multi-layer wiring.

10 Claims, 16 Drawing Figures

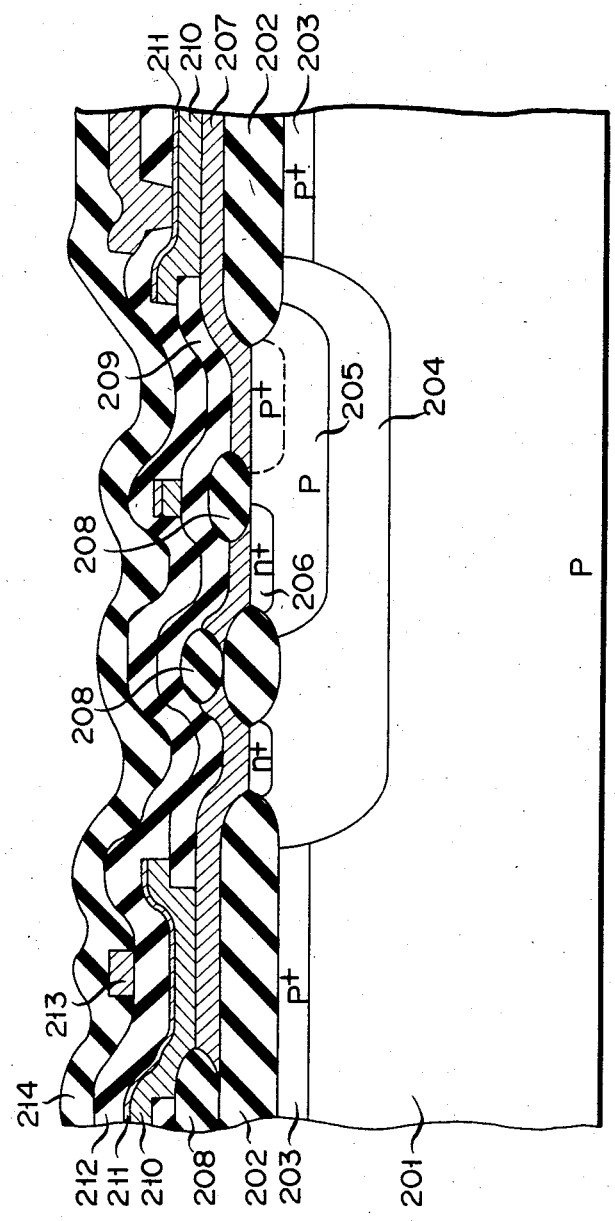

SEMICONDUCTOR DEVICE AND METHOD FOR MANUFACTURING THE SAME

BACKGROUND OF THE INVENTION

The present invention relates to a semiconductor device and a method for manufacturing the same and, more particularly, to both an MOS and a bipolar devices having a first polycrystalline silicon (poly-Si) layer which contacts a semiconductor substrate through a contact hole and a second poly-Si layer which is formed on the first poly-Si layer to serve as a low resistivity wiring and a resistor element, and to a method for manufacturing the MOS devices.

To dope metal into a poly-Si layer which serves as low resistivity wiring is a well known method to achieve high speed electric operation of semiconductor devices.

In a semiconductor shown in FIG. 1, an alloy layer 4 consisting of a metal and silicon is formed on a poly-Si layer 3 which is electrically connected to a semiconductor substrate 2 through a contact hole 1. The alloy layer 4 is connected to Al wiring 6 through a contact hole 5. The poly-Si layer 3 contains a great amount of metal in the surface portion close to the alloy layer 4. However, the concentration of metal in the poly-Si layer 3 decreases with an increase in the depth thereof. The metal is not substantially contained in the bottom portion of the poly-Si layer 4.

Reference numeral 7 denotes a shallow diffusion region formed in the semiconductor substrate 2 by diffusing an impurity from the poly-Si layer 3 into the semiconductor substrate 2. Reference numeral 8 denotes a field oxide film; reference numeral 9 denotes an insulating film; and reference numeral 10 denotes a protective film such as a PSG. The metal should not be contained in the bottom portion of poly-Si layer 3, to avoid the diffusion through the buried contact hole 1 together with the impurity contained in the poly-Si layer 3 into the semiconductor substrate. This is because the metal diffusion from the poly-Si layer 3 causes alloy spike in the semiconductor substrate, which results in breaking the p-n junction of the shallow diffusion region 7 into an ohmic junction.

In order to prevent alloy spike, the alloy layer 4 must be about 50 to 100 Å thick. Therefore low sheet-resistivity poly-Si layer, lower than about several ohms per sheet, is hard to obtain. Furthermore, the increase of the poly-Si layer does not serve to decrease the sheet resistivity much because the thickness of alloy layer 4 cannot be more than about 100 Å in order to avoid the alloy spike damage. Therefore, the conventional metal-doping into a poly-Si layer is not a very effective method to obtain a low resistivity wiring layer. Accordingly, it is difficult to make a high-speed semiconductor device by the conventional metal-doping method.

SUMMARY OF THE INVENTION

It is an object of the present invention to provide a semiconductor device wherein high-speed operation of the device can be achieved by an additional low resistivity layer.

It is an another object of the present invention to provide a semiconductor device wherein a high packing density of the device is achieved by a multi-layer wiring.

According to an aspect of the present invention, there is provided a semiconductor device comprising: a semiconductor substrate having an active region including a buried contact and a field region including a field insulation layer; a first polysilicon layer formed in said active region and on said field insulation layer; and a second polysilicon layer a portion of which is formed on said first polysilicon layer and another portion of which is formed on an isolation film covering a portion of said first polysilicon layer, that portion of said second polysilicon layer which is located above said field insulation layer being doped with metal or having a surface covered with a metal film.

In the semiconductor device having the above structure, the first poly-Si layer can contact a second poly-Si layer containing metal in a high concentration in a region excluding the buried contact area. Thus, alloy spike may be prevented, and high-speed operation and reduction of the device size by multi-layer wiring with the low resistive second poly-Si layer in addition to the first poly-Si layer can be achieved.

BRIEF DESCRIPTION OF THE DRAWINGS

FIG. 8 is a sectional view of a semiconductor device according to still another embodiment of the present invention.

DETAILED DESCRIPTION OF THE PREFERRED EMBODIMENTS

Figure 1:
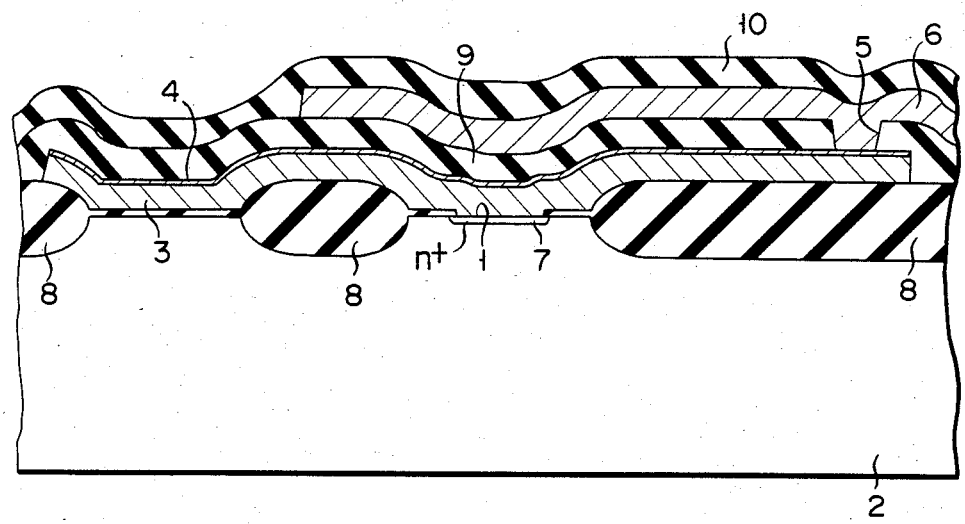
FIG. 1 is a sectional view of a conventional semiconductor device.
Figure 2:
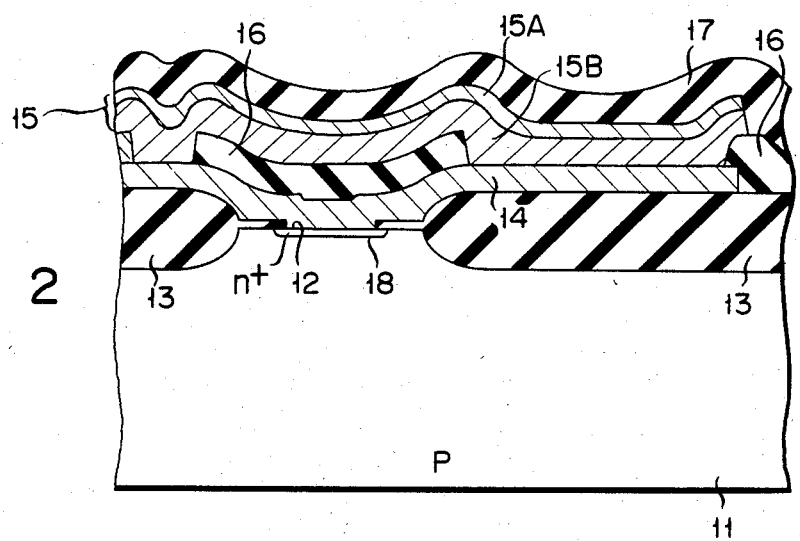
FIG. 2 is a sectional view of a semiconductor device according to an embodiment of the present invention.

FIG. 2 shows a semiconductor device according to a basic embodiment of the present invention.

Referring to FIG. 2, reference numeral 11 denotes a p-type semiconductor substrate. The p-type semiconductor substrate 11 is covered by a field oxide film 13 except for an active region including a contact hole 12. A first poly-Si layer 14 is formed on the field oxide film 13 and on the active region where a portion of the first poly-Si layer 14 is electrically connected to the p-type semiconductor substrate 11 through the contact hole 12. Reference numeral 15 denotes a second poly-Si layer selectively formed on the first poly-Si layer 14 and on an insulating film 16. The second poly-Si layer 15 is constituted by an alloy layer 15A and a poly-Si layer 15B, the latter having a metal content lower than that of the former. The insulating film 16 is located above the contact hole 12 and is laid between the first poly-Si layer 14 and the second poly-Si layer 15. Reference numeral 17 denotes a protective film such as a PSG (phospho silicate glass); and 18, a shallow diffusion layer formed by diffusing the impurity from in the first poly-Si layer into the p-type semiconductor substrate 11.

In the semiconductor device having the structure described above, a portion of the second poly-Si layer 15 which is located above the contact hole 12 does not contact the first poly-Si layer 14 because of the presence of the insulating film 16 therebetween. Although the metal contained in the second poly-Si layer 15 is somewhat diffused into the first poly-Si layer 14, the metal diffusion length is short enough that no metal reaches the buried contact 12 through those portions of the first poly-Si layer which are located on the field oxide film 13 and on the buried contact 12. Accordingly, no alloy spike is formed in the substrate by the metal-doped second poly-Si layer 15. Therefore, it is possible to decrease a resistance of the second poly-Si layer 15 by doping a sufficient amount of metal therein.

For example, when the second poly-Si layer is 3000 Å thick, its sheet resistance can be decreased to be about 0.1 ohms per sheet or less. Furthermore, since the first poly-Si layer 14 can contact the second poly-Si layer 15 over a large area above the field oxide film except in the area above the contact hole 12, the resistance of the portion of the first poly-Si layer 14 which contacts the second poly-Si layer 15 can be sufficiently decreased. Therefore, high-speed operation can be achieved. Furthermore, since the second poly-Si layer can be used as an additional wiring layer, multi-layer wiring structure and high packing density can be achieved. Furthermore, it is possible to form a portion of the second poly-Si layer 15 which does not contain metal. Such a portion may be used as a resistive element.

The first poly-Si layer preferably contains an impurity such as arsenic, phosphorus or boron in concentration of more than $10^{16}$ cm$^{-3}$ for the purpose of low resistivity layer. The second poly-Si layer may contain an impurity such as arsenic, phosphorus or boron in concentration of less than $10^{16}$ cm$^{-3}$ so as to control the resistance.

A metal which is doped in the second poly-Si layer or deposited on the surface of the second poly-Si layer may be at least one of a group consisting of platinum, palladium, nickel, cobalt, iron, tungsten, molybdenum, chromium, tantalum, niobium, vanadium, hafnium, zirconium and titanium.

Examples of the present invention will be described hereinafter.

Examples 1 to 3 are methods of producing a MOS type semiconductor device having a static memory cell. In the devices of these Examples, part of a second poly-Si layer acts as a high resistance load.

EXAMPLE 1

(i) A field oxide film 102 and a channel stopper (not shown) comprising a high-impurity diffusion region formed under the field oxide film 102 were formed on a p-type silicon substrate 101. Thermal oxidation was then performed to form a gate oxide film 103 on a surface of the p-type silicon substrate 101 which was surrounded by the field oxide film 102. A contact hole 104 was made in the gate oxide film 103. An arsenic-doped poly-Si layer was deposited to cover the entire surface and was formed into first poly-Si patterns 105$_1$ and 105$_2$ which function as the gate electrodes on the gate oxide film 103 and poly-Si wiring layers 106$_1$ and 106$_2$ on the field oxide film 102.

Figure 4A:
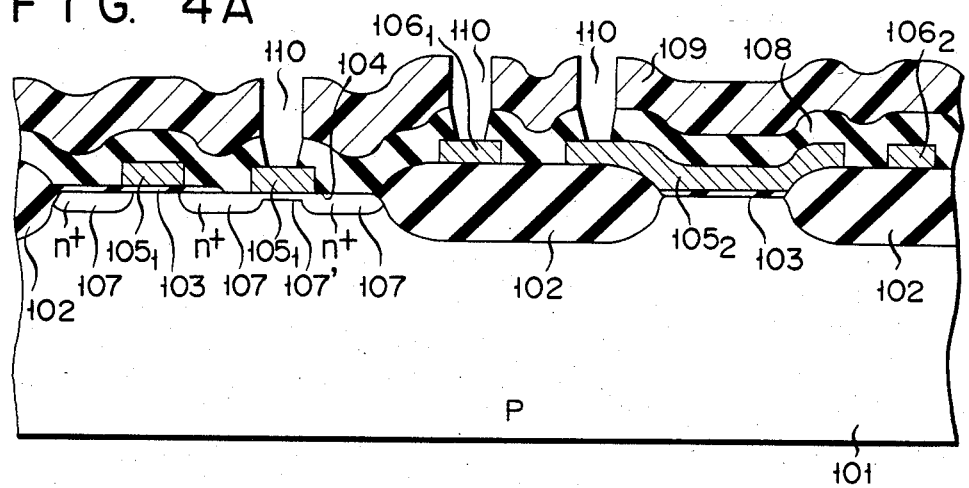
FIGS. 4A to 4F are sectional views showing the steps of manufacturing a semiconductor device according to Example 1 of the present invention.

Part of the first poly-Si pattern 105$_1$ directly contacts the p-type silicon substrate 101 through the contact hole 104. An n-type impurity such as arsenic was ion-implanted into the p-type silicon substrate 101 through the gate oxide film 103 using the first poly-Si patterns 105$_1$ and 105$_2$ and the field oxide film 102 as masks. Thereafter, annealing was performed to remove the ion-implant detect from the silicon substrate. As a result, n$^+$-type impurity regions 107 as the source, drain and wiring regions were formed in a self-aligned manner with respect to the first poly-Si patterns 105$_1$ and 105$_2$. At the same time, a shallow n$^+$-type impurity region 107' was formed in the surface region of the p-type silicon substrate 101 under a portion of the contact hole 104 by diffusing arsenic from the first poly-Si pattern 105$_1$. Thereafter, a first CVD-SiO$_2$ film was deposited, thus covering the entire surface, and photoresist was coated on the first CVD-SiO$_2$ film, and then selectively etched, thereby forming a photoresist pattern 109. Using the photoresist pattern 109 as a mask, the first CVD-SiO$_2$ film was etched to have contact holes in the first CVD-SiO$_2$ pattern 108. As a result, contact holes 110 were formed and electrically connect the first poly-Si patterns 105$_1$ and 105$_2$ and the poly-Si wiring layer 106$_1$ with the second poly-Si layer deposited thereon (FIG. 4A).

Figure 4B:
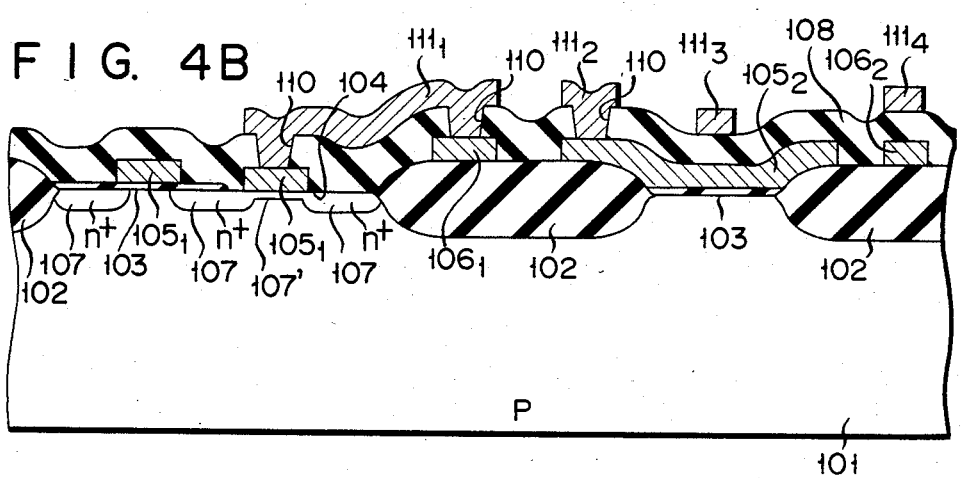

(ii) After the photoresist pattern 109 was removed, an arsenic-doped poly-Si layer of low impurity-concentration was deposited, thus covering the entire surface, and was then formed into a second poly-Si pattern 111$_1$, which was connected to the first poly-Si pattern 105$_1$ and the poly-Si wiring layer 106$_1$ through the contact holes 110, a second poly-Si pattern 111$_2$, which was connected to the first poly-Si pattern 105$_2$ through the contact hole 110, and second poly-Si patterns 111$_3$ and 111$_4$, which were formed on the first CVD-SiO$_2$ pattern 108 (FIG. 4B). The second poly-Si pattern 111$_1$ serves as a high-resistivity load.

Figure 4C:
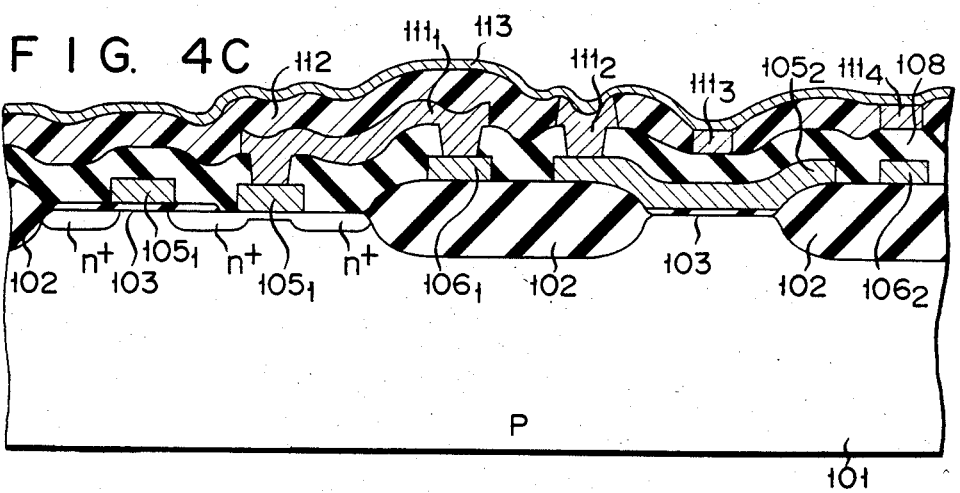
Figure 4D:
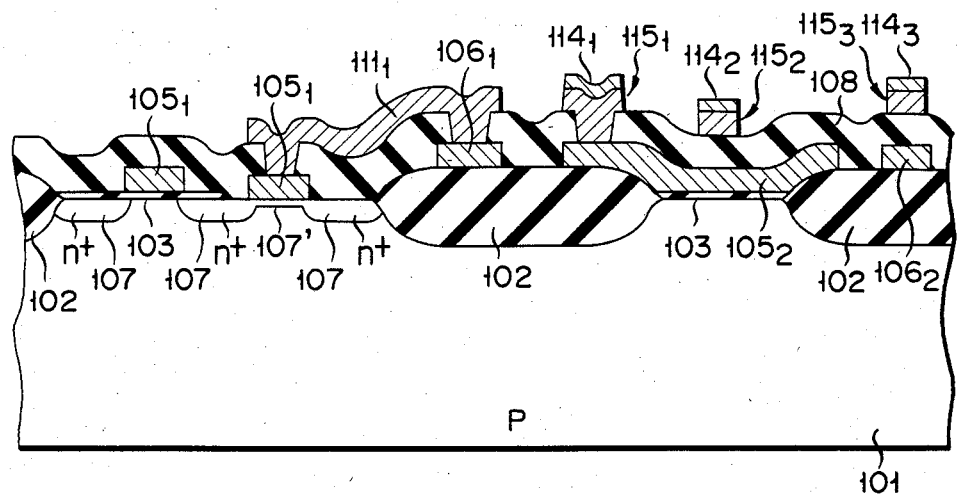

(iii) A photoresist was coated on the entire surface and etched into a photoresist pattern 112, thus exposing the surfaces of second poly-Si patterns 111$_2$ to 111$_4$. Thereafter, a platinum layer 113 was deposited on the entire surface by sputtering (FIG. 4C). Subsequently, the photoresist pattern 112 was removed and a portion of the platinum layer on the photoresist pattern 112 was removed, thus forming the residual platinum patterns 114$_1$ to 114$_3$ respectively on the second poly-Si patterns 111$_2$ to 111$_4$. The structure was then annealed. As a result, as shown in FIG. 4D, platinum was diffused from the platinum patterns 114$_1$ to 114$_3$ into the second poly-Si patterns 111$_2$ to 111$_4$. Thus, Si-Pt alloy patterns 115$_1$ to 115$_3$ (second poly-Si patterns including metal atoms) were formed.

The temperature for the alloying heat must not be higher than the temperature of annealing performed after the ion-implantation for the source and drain regions. Otherwise, the impurity in the source and drain regions will be further diffused in the vicinity of the substrate surface, the MOS-transistor structure will be deformed, and no satisfactory characteristics will be obtained.

Figure 4E:
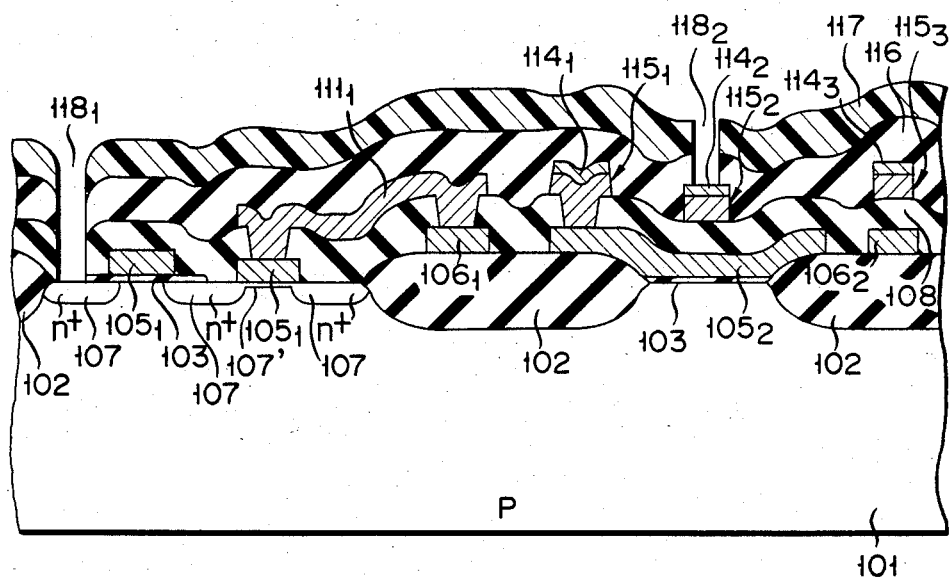

(iv) A second CVD-SiO$_2$ film was deposited to cover the entire surface. A photoresist film was coated on the CVD-SiO$_2$ film, and then etched into a photoresist pattern 117 having holes corresponding to the contact areas with the Al wiring. Using the photoresist pattern 117 as a mask, both CVD-SiO$_2$ pattern 108 and 116, and the gate oxide film 103 were etched to form a contact holes 118$_1$. Furthermore, the second CVD-SiO$_2$ pattern 116 is etched, thus forming a contact holes 118$_2$ (FIG. 4E). Subsequently, the photoresist pattern 117 was removed and an Al film was formed on the entire surface.

An Al wiring layer 119 was formed which was connected to the n+-type impurity region through the contact hole $118_1$ and to the platinum pattern $114_2$ on the Si-Pt alloy pattern $115_2$ through the contact hole $118_2$. Thereafter, a protective film 120 of PSG was deposited on the entire surface. Windows (not shown) for bonding pads were then formed to prepare an MOS device (FIG. 4F).

Figure 4F:
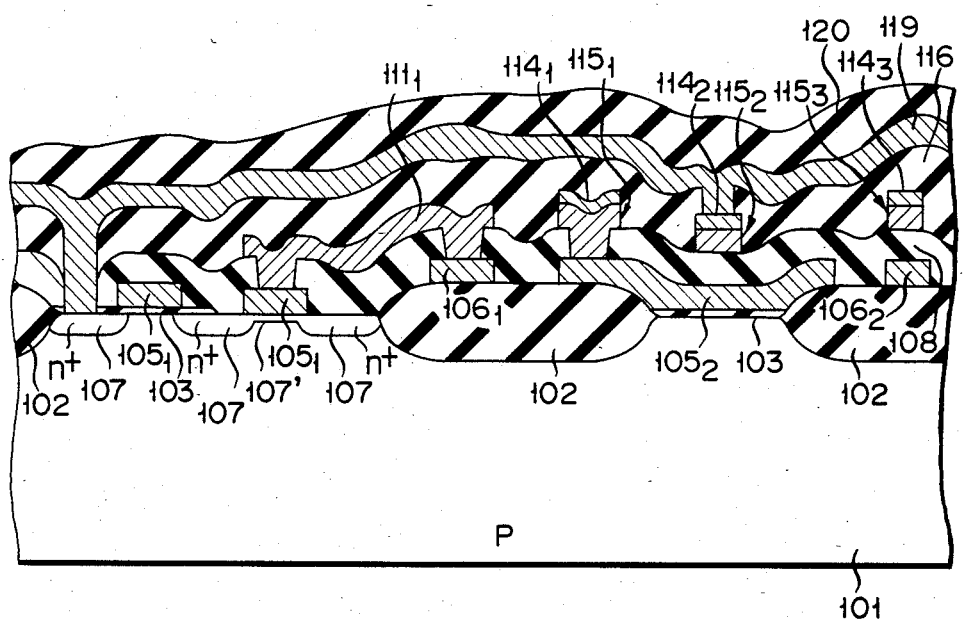

In the MOS device shown in FIG. 4F according to the present invention, the second poly-Si pattern $111_1$ which functions as a high-resistivity load is formed on the first CVD-SiO$_2$ layer 108 covering the first poly-Si pattern $105_1$ and the poly-Si wiring layer $106_1$. The Si-Pt alloy patterns $115_1$ to $115_3$ (second poly-Si patterns including metal atoms) having the platinum patterns $114_1$ to $114_3$ thereon are formed. As a result, the low-resistivity Si-Pt alloy patterns $115_1$ to $115_3$ can be formed on the first poly-Si pattern $105_2$ on the same layers on which the second poly-Si pattern $111_1$ which functions as the high-resistivity load is formed. Thus, a high-speed MOS device can be obtained. Furthermore, since sufficiently low-resistivity Si-Pt alloy patterns $115_1$ to $115_3$ can be formed, a multi-layer wiring structure can be obtained by the second poly-Si layer in addition to the n+-type impurity region, first poly-Si wiring layers $106_1$ and $106_2$ and the Al wiring layer 119. For example, in the structure shown in FIG. 4F, the first poly-Si wiring layer $106_2$ and the Si-Pt alloy pattern $115_3$ having the platinum pattern $114_3$ thereon are formed under the aluminum wiring layer and are electrically insulated from each other.

EXAMPLE 2

Figure 5A:
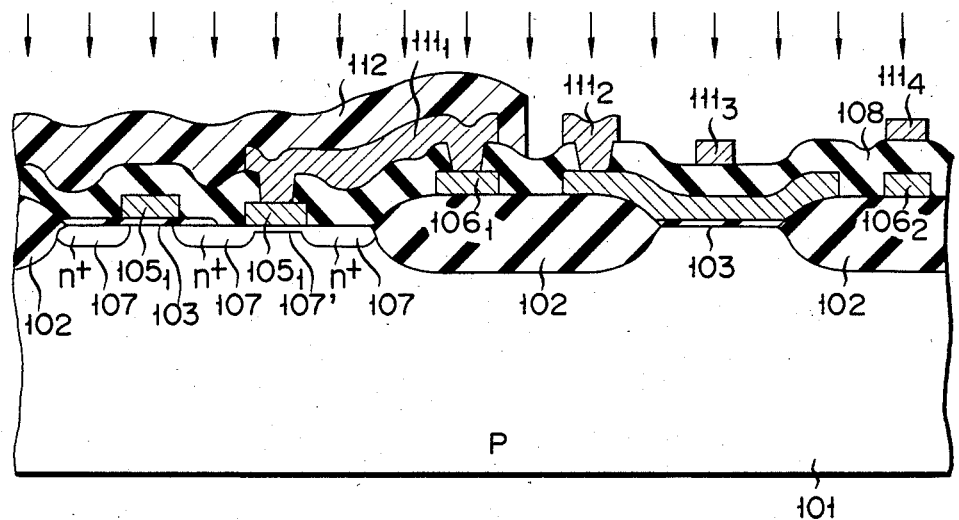
FIGS. 5A and 5B are sectional views showing the steps of manufacturing a semiconductor device according to Example 2 of the present invention.
Figure 5B:
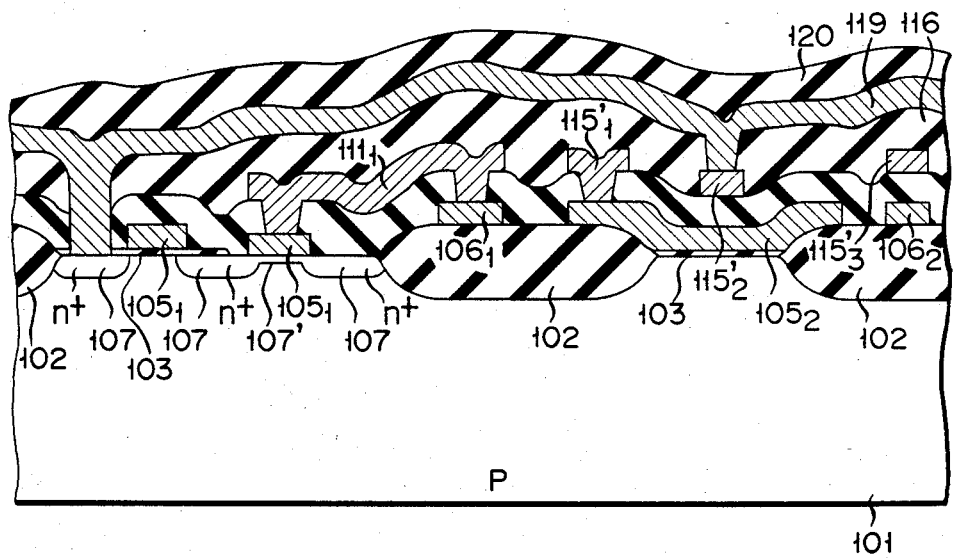

After the second poly-Si patterns $111_1$ to $111_4$ were formed in the same manner as steps (i) and (ii) of Example 1, photoresist was coated on the entire surface and was then etched into a photoresist pattern 112 so as to expose the second poly-Si patterns $111_2$ to $111_4$. Using the photoresist pattern 112 as a mask, metal atoms (e.g., molybdenum) were ion-implanted in the second poly-Si patterns $111_2$ to $111_4$ at a concentration of $10^{17}$ cm$^{-3}$ (FIG. 5A). Subsequently, the photoresist pattern 112 was removed, and thermal annealing or laser annealing was performed to diffuse molybdenum into the second poly-Si patterns $111_2$ to $111_4$, thus forming Si-Mo alloy patterns $115_1'$ to $115_3'$. The remaining molybdenum on the first CVD-SiO$_2$ pattern 108 and on the Si-Mo alloy patterns $115_1'$ to $115_3'$ was chemically washed off by nitrohydrochloric acid. In the same manner as in Example 1, a second CVD-SiO$_2$ pattern 116, an Al wiring layer 119, a protective film 120, and windows for bonding pads were formed. An MOS device is completed (FIG. 5B).

According to Example 2, the Si-Mo alloy patterns $115_1'$ to $115_3'$ can be readily formed in a similar method to form the source and drains by ion-implantation, in comparison with Example 1.

EXAMPLE 3

Figure 6A:
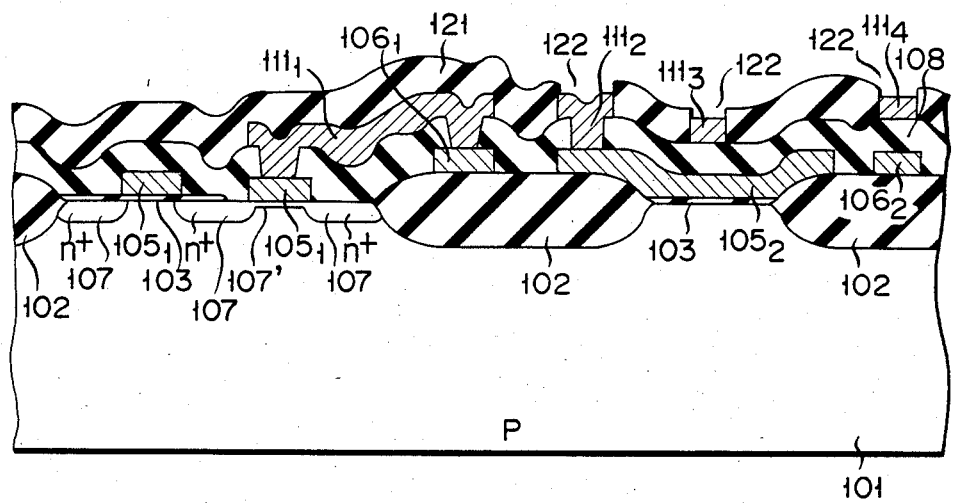
FIGS. 6A to 6C are sectional views showing the steps of manufacturing a semiconductor device according to Example 3 of the present invention.

(i) The second poly-Si patterns $111_1$ to $111_4$ were formed in the same manner as steps (i) and (ii) of Example 1. Thereafter, a CVD-SiO$_2$ film was deposited to cover the entire surface and a photoresist was coated on the CVD-SiO$_2$ film. The photoresist then patterned. Using the patterned photoresist as a mask, the CVD-SiO$_2$ film was selectively etched, thereby forming a CVD-SiO$_2$ pattern 121. Thus, the areas 112 of the second poly-Si patterns were exposed. The photoresist was then removed (FIG. 6A).

Figure 6B:
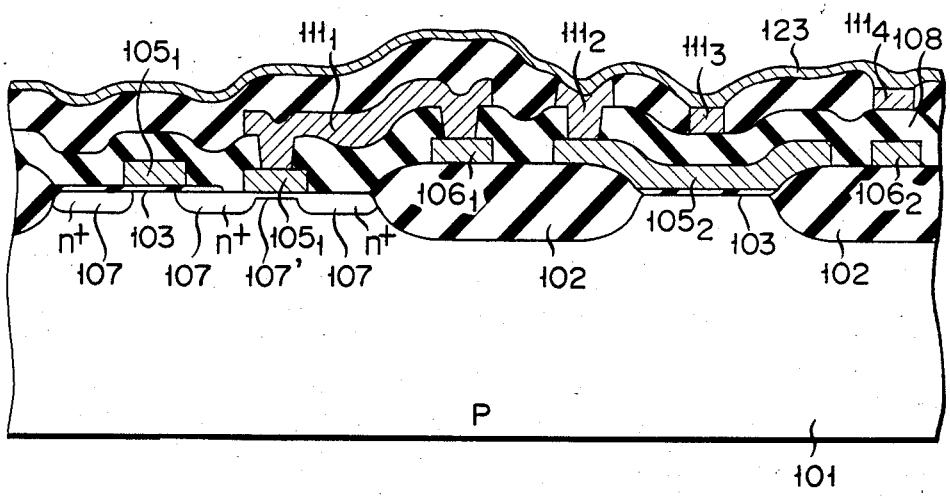
Figure 6C:
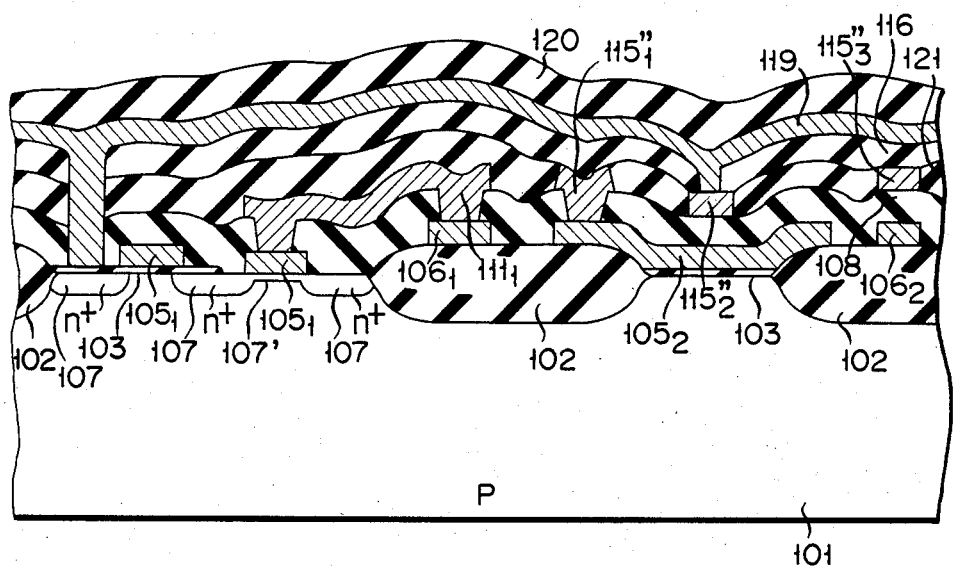

(ii) A thin palladium layer 123 was deposited by the CVD method on the entire surface at a temperature lower than the annealing temperature forming n+impurity regions 107 in order to prevent the additional impurity diffusion (FIG. 6B). Subsequently, thermal annealing or laser annealing was performed, thus diffusing palladium into the second poly-Si patterns $111_2$ to $111_4$ all over the exposed areas 122 to form Si-Pd alloy patterns $115_1''$ to $115_3''$. A palladium layer portion left on the CVD-SiO$_2$ pattern 121 and on the Si-Pd alloy patterns $115_1''$ to $115_3''$ was removed by nitrohydrochloric acid. In the same manner as in Example 1, a second CVD-SiO$_2$ pattern 116, an Al wiring layer 119, a protective film 120 and windows for bonding pads were formed to complete an MOS device (FIG. 6C).

According to Example 3, an MOS device can be obtained which has the second poly-Si pattern $111_1$ as the high-resistivity load and Si-Pd alloy patterns $115_1''$ to $115_2''$ as the low-resistivity wiring.

The effects of the present invention was ascertained with 4K bits static RAM's produced by the examples described above, as described in the following.

Figure 3:
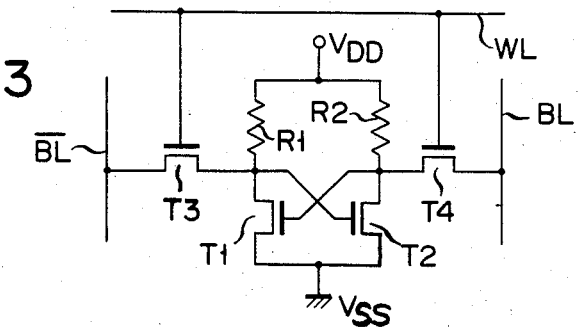
FIG. 3 is a circuit diagram of a static memory cell.

As shown in FIG. 3, a 4K bits static RAM was prepared which comprised: MOS transistors T1 to T4 each having a gate formed by the first poly-Si pattern containing phosphorus in concentration of $10^{19}$ cm$^{-3}$; high-resistivity loads R1 and R2 each of which was formed by the second poly-Si pattern having a sheet resistance of 100 M$\Omega$/□ and containing arsenic of $10^{15}$ cm$^{-3}$, which had a resistance of 500 M$\Omega$ and both of which construct a flip-flop circuit together with driver MOS-transistor T1 and T2; and a word line WL which had the first poly-Si patterns as the gate electrodes of the transfer MOS transistors T3 and T4 connecting to two bit lines BL and $\overline{BL}$ and the second poly-Si pattern which contained metals shown in the following table and was connected to the first poly-Si pattern through contact holes made in the insulating film on the first poly-Si pattern for each eight memory cells. The static RAM had a cell structure and a peripheral circuit thereof had a multilayer wiring structure by the second poly-Si pattern which contained metal.

In the static RAM having the above structure, since the effective resistance of the word line is decreased, the signal propagation delay in the word line is much reduced. Thus, the READ access time can be shortened. Furthermore, since the second poly-Si containing metal and having a low resistivity is used in the peripheral circuits, the high-speed operation speed can be obtained. Furthermore, since the high-resistive element formed of the second poly-Si pattern is used to constitute the multi-layer stacked memory cells, the cell area can be decreased. Further, the multi-layer wiring structure including the second poly-Si can reduce the wiring area of the peripheral circuits.

The above 4K bits static RAM is compared with a conventional 4K bits static RAM (a comparative example) in which the first poly-Si pattern comprises low-resistive regions containing arsenic in concentration of more than $10^{19}$ cm$^{-3}$ to provide gate electrodes, VDD power supply lines and word lines in the cell array, gate electrodes and wiring in the peripheral circuits, and high-resistive regions containing arsenic in concentration of less than $10^{15}$ cm$^{-3}$ for high-resistive cell loads R1 and R2. The results are shown in the following table.

TABLE

| | Word line structure | Method for forming second low-resistive poly-Si pattern | Metal for second low-resistive poly-Si pattern | Access time (ns) | Memory cell area ($\mu^2$) | Peripheral circuit area (mm$^2$) | Chip area (mm$^2$) |
|---|---|---|---|---|---|---|---|
| Comparative Example | First phosphorus-doped poly-Si pattern with more than $10^{19}$ concentration | — | — | 90 | 782 | 4.52 | 7.73 |
| Example 1 | First phosphorus-doped poly-Si pattern and second low-resistive poly-Si pattern | Metal deposition by sputtering to a thickness of 3,000 Å | Platinum | 45 | 616 | 3.71 | 6.23 |
| Example 2 | First phosphorus-doped poly-Si pattern and second low resistive poly-Si pattern | Ion-implantation at an acceleration voltage of 250 Kev and at a dose of $10^{17}$ cm$^{-2}$ | Molybdenum | 70 | 616 | 3.71 | 6.23 |
| Example 3 | First phosphorus-doped poly-Si pattern and second low resistive poly-Si pattern | Metal-CVD | Palladium | 55 | 616 | 3.71 | 6.23 |

Figure 7:
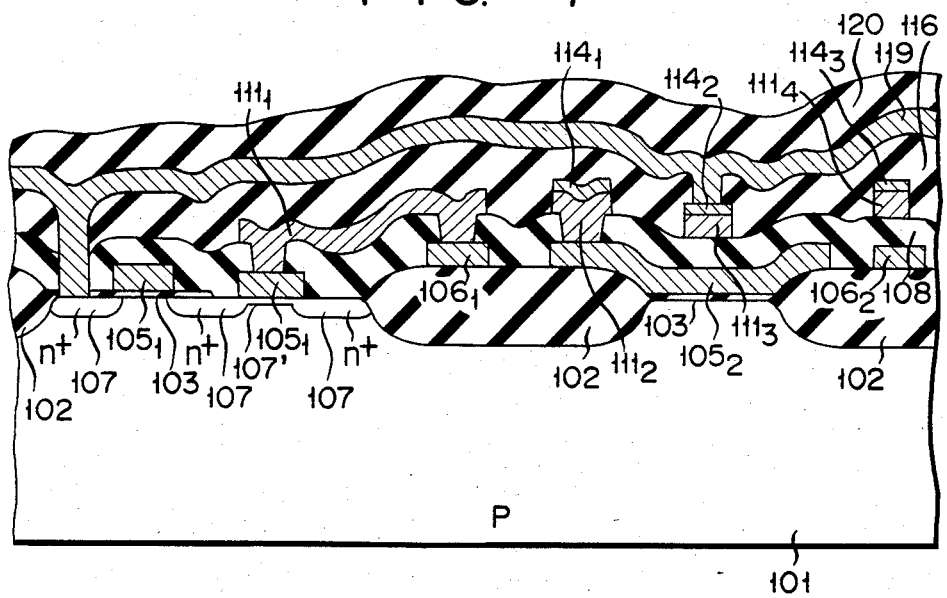
FIG. 7 is a sectional view of a semiconductor device according to an another embodiment of the present invention.

The semiconductor device of the present invention is not limited to the embodiments described above. For example, as shown in FIG. 7, after an impurity is diffused into the second poly-Si patterns $111_2$ to $111_4$ in a high concentration by ion-implantation with a photoresist mask, platinum layer is laid and then the platinum patterns $114_1$ to $114_3$ may be formed thereon by removing the portion of the platinum layer on the photoresist together with photoresist in lift-off method. These platinum patterns $114_1$ to $114_3$ may be used as wiring layers without annealing for forming an alloy. Furthermore, in addition to the MOS device, other semiconductor devices having a buried contact and poly-Si layer may be manufactured in the similar process of the present invention. For example, the present invention may be applied to bipolar transistor devices.

FIG. 8 shows an NPN-bipolar transistor having emitter, base and collector regions terminated to a first poly-Si layer connected to these regions. The transistor comprises a p-type silicon substrate 201, a field oxide film 202, a p+-channel stopper region 203, an n-type collector region 204, a p-type base region 205, an n+ emitter region 206, a first poly-Si layer 207, a selective oxide layer 208 formed by selectively oxidation of the first poly-Si layer 207, a first CVD-SiO$_2$ film 209, a second poly-Si layer 210, a platinum film 211 formed on the surface of the second poly-Si layer 210, a second CVD-SiO$_2$ film 212, an Al-wiring layer 213, and a PSG protective film 214.

What is claimed is:

1. A semiconductor device comprising:
    a semiconductor substrate having an active region including a buried contact and a field region with a field insulation layer;
    a first polysilicon layer formed on said semiconductor substrate and electrically connected to said active region through said buried contact;
    an isolation film formed on a portion of said first polysilicon region in contact with said buired contact; and
    a second polysilicon layer formed on said first polysilicon layer and said isolation film, a portion of said second polysilicon layer being located above said field insulation layer, being doped with a metal and in electrical contact with said first polysilicon layer.

2. A semiconductor device comprising:
    a semiconductor substrate having an active region including a buried contact and a field region with a field insulation layer;
    a first polysilicon layer formed on said semiconductor substrate and electrically connected to said active region through said buried contact;
    an insolation film formed on a portion of said first polysilicon layer in contact with said buried contact; and
    a second polysilicon layer formed on said first polysilicon layer and said isolation film, a portion of said second polysilicon layer being located above said field insulation layer, having a surface covered with a metal film and being in electrical contact with said first polysilicon layer.

3. A device according to claim 1 or 2, wherein said first polysilicon layer contains an impurity in concentration of more than $10^{16}$ cm$^{-3}$.

4. A device according to claim 1, wherein said second polysilicon layer contains atoms of the metal in concentration of more than $10^{16}$ cm$^{-3}$.

5. A device according to claim 1 or 2, wherein the metal is at least one member selected from the group consisting of platinum, palladium, nickel, cobalt, iron, tungsten, molybdenum, chromium, tantalum, niobium, vanadium, hafnium, zirconium and titanium.

6. A device according to claim 1 or 2, wherein said second polysilicon layer functions as a resistive load.

7. A device according to claim 1 or 2, wherein said second polysilicon layer is formed in a memory cell region.

8. A device according to claim 7, wherein said second polysilicon layer functions as resistive loads having a resistance of more than 1 MΩ.

9. A device according to claim 8, wherein said second polysilicon layer contains an impurity other than metal in concentration of less than $10^{16}$ cm$^{-3}$.

10. A device according to claim 8 or 9, wherein the metal doped portion of said second polysilicon layer comprises wiring electrically connected in parallel with word lines which supply signals for simultaneous turning on or off transfer gates of memory cells.

* * * * *